(12) United States Patent
Lim et al.

(10) Patent No.: US 11,716,908 B2
(45) Date of Patent: Aug. 1, 2023

(54) COST-EFFECTIVE HIGH-BENDING-STIFFNESS CONNECTOR AND PIEZOELECTRIC ACTUATOR MADE OF SUCH

(71) Applicant: MICROFINE MATERIALS TECHNOLOGIES PTE LTD, Singapore (SG)

(72) Inventors: Leong Chew Lim, Singapore (SG); Yu Huang, Singapore (SG); Yuexue Xia, Singapore (SG); Dian-Hua Lin, Singapore (SG)

(73) Assignee: MICROFINE MATERIALS TECHNOLOGIES PTE LTD, Singapore (SG)

( * ) Notice: Subject to any disclaimer, the term of this patent is extended or adjusted under 35 U.S.C. 154(b) by 796 days.

(21) Appl. No.: 16/621,835

(22) PCT Filed: Jun. 12, 2017

(86) PCT No.: PCT/SG2017/050297
§ 371 (c)(1),
(2) Date: Dec. 12, 2019

(87) PCT Pub. No.: WO2018/231144
PCT Pub. Date: Dec. 20, 2018

(65) Prior Publication Data
US 2020/0176665 A1 Jun. 4, 2020

(51) Int. Cl.
*B06B 1/06* (2006.01)
*H02N 2/02* (2006.01)
(Continued)

(52) U.S. Cl.
CPC .......... *H10N 30/88* (2023.02); *B06B 1/0633* (2013.01); *H02N 2/02* (2013.01); *H10N 30/206* (2023.02);
(Continued)

(58) Field of Classification Search
CPC .............. H01L 41/053; H01L 41/0833; H01L 41/1876; H01L 41/1875; B06B 1/0618; B06B 1/0633; H02N 2/02
See application file for complete search history.

(56) References Cited

U.S. PATENT DOCUMENTS 6,097,671 A 8/2000 Merewether
6,678,213 B1 1/2004 Rask
(Continued)

FOREIGN PATENT DOCUMENTS

CN 102136268 9/2012
CN 206134236 U 4/2017
(Continued)

OTHER PUBLICATIONS

European Search Report for corresponding application EP 17 91 3388; Report dated Dec. 10, 2020.
(Continued)

*Primary Examiner* — J. San Martin
(74) *Attorney, Agent, or Firm* — Cantor Colburn LLP

(57) ABSTRACT

Cost effective connectors of high bending stiffness for making high-performance piezoelectric actuators and derivative devices are disclosed. In one embodiment, the connector has circumferentially alternating recesses of circular cross-section which can be cost-effectively machined out with conventional machining techniques. The circular recesses can be adopted to house circular or non-circular cross-sectioned piezoelectric active elements to make cost effective 2-level (2×) piezoelectric displacement actuators.
(Continued)

SECTION B – B

In another embodiment, the non-circular cross-sectioned recesses in the connector include suitable wall openings to enable said recesses to be machined out cost effectively via conventional machining techniques, or via reduced use of non-conventional machining techniques. Additional stiffening mechanisms can be added to minimize the bending displacement of the base of recesses when desired. Cost effective derivative devices, such as high-performance multi-level displacement actuators and compact Langevin low-frequency underwater projectors, can be made from such connectors.

21 Claims, 23 Drawing Sheets

(51) Int. Cl.
H10N 30/88 (2023.01)
H10N 30/20 (2023.01)
H10N 30/853 (2023.01)

(52) U.S. Cl.
CPC ..... H10N 30/8548 (2023.02); H10N 30/8554 (2023.02)

(56) References Cited

U.S. PATENT DOCUMENTS

| 8,717,849 B1 | 5/2014 | Zarnetske | |
|---|---|---|---|
| 2018/0097457 A1* | 4/2018 | Zhong | H02N 2/02 |
| 2019/0103821 A1* | 4/2019 | Lim | H02N 2/02 |

FOREIGN PATENT DOCUMENTS

| WO | 2017176209 A1 | 10/2017 | |
| WO | WO-2018041241 A1 * | 3/2018 | B06B 1/0611 |

OTHER PUBLICATIONS

Yu Huang, "High-Bending-Stiffness Connector (HBSC) and High-Authority Piezoelectric Actuator (HAPA) Made of Such", Actuators 2018, 7 61, pp. 1-11, ww.mdpi.com.

International Preliminary Report of Patentability for corresponding application PCT/SG2017/050297 filed Jun. 12, 2017; dated Mar. 20, 2018.

International Search Report for corresponding application PCT/SG2017/050297 filed Jun. 12, 2017; dated Sep. 13, 2017.

Written Opinion for corresponding application PCT/SG2017/050297 filed Jun. 12, 2017; dated Sep. 13, 2017.

* cited by examiner

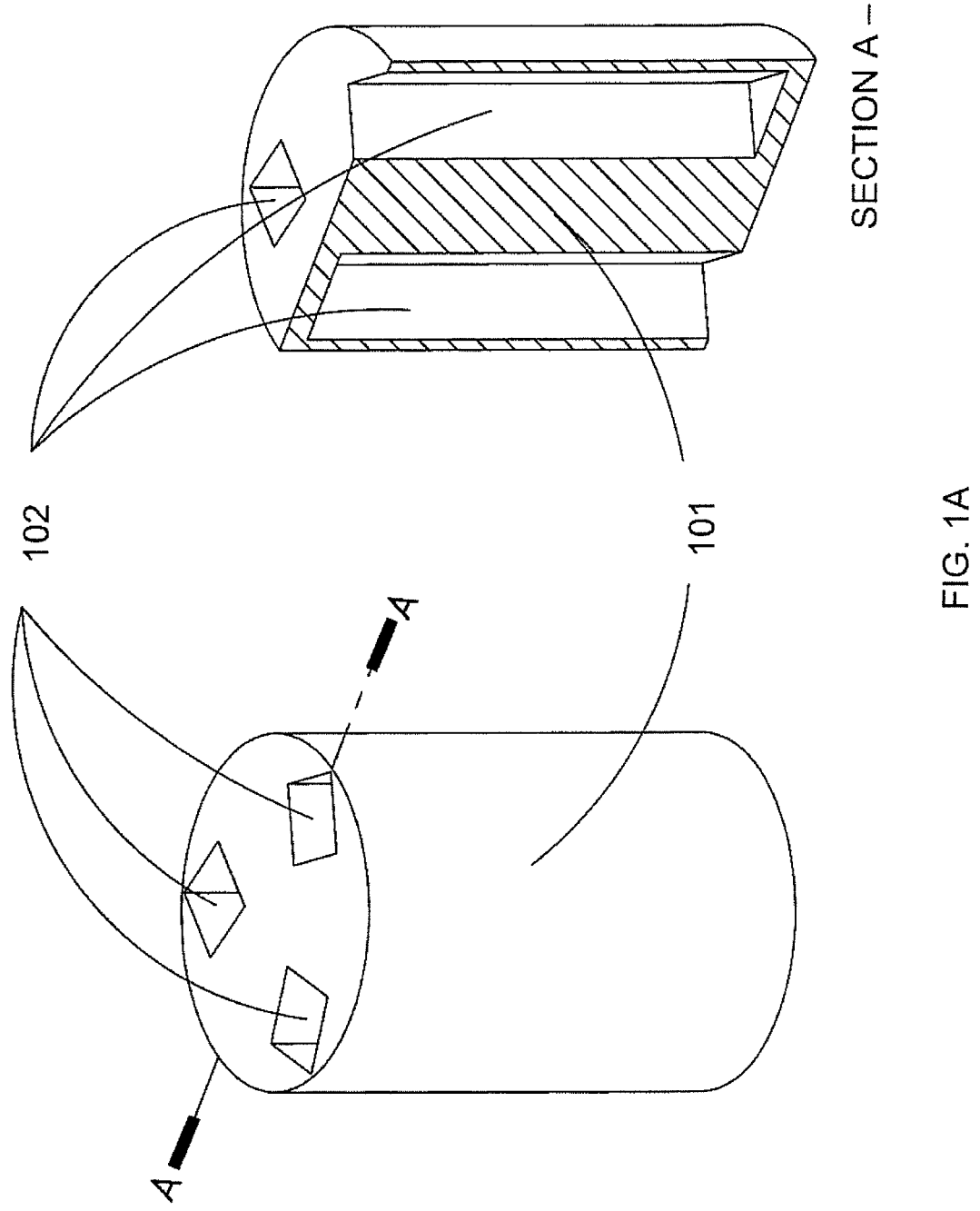

SECTION B – B

COST-EFFECTIVE HIGH-BENDING-STIFFNESS CONNECTOR AND PIEZOELECTRIC ACTUATOR MADE OF SUCH

TECHNICAL FIELD

The present invention relates to displacement connectors of high bending stiffness and, in particular, to high-performance piezoelectric actuators that are inexpensive to produce.

BACKGROUND

Piezoelectricity is the electric charge that accumulates in certain solid materials in response to an external mechanical stress. The piezoelectric effect is a reversible process in that materials exhibiting the direct piezoelectric effect also exhibit the reverse piezoelectric effect. That is, a piezoelectric element can generate internal mechanical strain from an applied electrical field.

Accordingly, a piezoelectric element can be used as a driving source for generating a mechanical displacement. However, as the amount of deformation of the piezoelectric element is generally small, it is often necessary to magnify the mechanical strain of a piezoelectric element and convert the same into a large amount of displacement when it is used as the driving source. Recent efforts have focused on designing actuators that use piezoelectric elements to generate a suitable mechanical displacement for a particular use.

Direct push-pull piezoelectric actuators include longitudinal ($d_{33}$) stacks and transverse ($d_{31}$) tube or bar actuators. They are of large blocking forces but low displacements, typically being about >100 N and <40 µm. To attain displacement >40 µm, stacks of hundreds of layers, measuring more than 100 mm in height are commercially available. These actuators have many practical uses in industrial, aerospace, defense, medical and scientific sectors.

Various displacement enhancement mechanisms have been devised to increase the displacement of these direct push-pull active elements, including lever-arm, flextensional, meander-line and telescopic approaches. However, due to their large bending compliance, both the displacement and blocking forces of such actuators are adversely affected.

Accordingly, there is a need for a high-performance piezoelectric actuator that overcomes these limitations. It should be inexpensive and easy to produce using conventional production techniques.

SUMMARY OF THE INVENTION

The summary above, as well as the following detailed description of illustrative embodiments, is better understood when read in conjunction with the appended drawings. For the purpose of illustrating the disclosure, exemplary constructions of the disclosure are shown in the drawings. However, the disclosure is not limited to specific methods and instrumentalities disclosed herein. Moreover, those in the art will understand that the drawings are not to scale The invention includes cost-effective designs of a high-bending-stiffness 2-level (HBS-2×) connector. When fitted with identical piezoelectric stacks, tubes or bars, the connector can produce approximately double axial displacement while maintaining comparable blocking force of respective active elements.

More specifically, the invention includes a small footprint, multi-level piezoelectric actuator of large overall axial displacement and blocking force, comprised of a high bending stiffness (HBS) connector and a plurality of piezoelectric active elements. The connector is comprised of (1) a elongated component of either circular, square, rectangular or polygonal cross-section having a first base, and a second base in an opposed, substantially parallel relationship to said first base, (2) a set of multiple connector recesses equally spaced and arranged circumferentially extending substantially through the connector from said second base, perpendicular to said second base, which intersperse with a set of recess housings extending from the first base at approximately equal angular separation along the circumference of the connector. The base of each connector recess is firmly connected to the connector body to minimize cantilever loading during use. Each circular cross-sectioned connector recess can house a piezoelectric active element with a non-circular-cross-sectional shape. The length of the piezoelectric active element is preferably slightly longer than the depth of the connector recess so that the piezoelectric active elements housed in both sets of connector recesses operate in unison to produce an overall axial displacement approximately twice (2×) that of respective piezoelectric active elements and of blocking force comparable to or larger than that of respective piezoelectric active elements.

The connector recesses can be of circular cross-sectional shape and fabricated by first machining circular holes through the connector body. Thereafter, one side of the opening of a hole can be sealed using shaped end plates and/or hole plugs via brazing, bonding, bolting or other suitable techniques. Each circular cross-sectional connector recess can house a piezoelectric active element with a circular cross-sectional shape. In an alternative design, each circular cross-sectional connector recess can house a piezoelectric active element with a non-circular cross-sectional shape.

Each connector recess can have a wall opening transversing the full length of the recess to enable the recess to be more easily machined out. Alternatively, each connector recess can have multiple wall openings located on different sides of the connector recess which can be physically interconnected. The combined vertical length of the openings can traverse the full length of the recess to enable the recess to be more easily machined out.

Each connector recess each can include a mouth and a body. In a preferred design, the mouth of each connector recess has no wall opening and is of larger circular cross-sectional area than its body to enable the recess to be more easily machined out. Each connector recess can have multiple wall openings along its body on different side walls that can be physically connected.

In alternative designs, the connector recesses are of triangular, square, rectangular or other polygonal shape. One or more additional stiffening mechanisms can be included to reduce the deflection displacement of the base of the connector recesses. Further, the connector can include a high-stiffness load pad bonded to the base inside at least one of the connector recesses. Portions of the connector can be cut out or removed (i.e. cut-outs, openings, blind and/or through holes) to reduce the weight and/or provide contact points to assist with production or use.

The connector can include a stiffening end-plate bonded onto at least one end face of said connector. It can also include a central hole passing through its center. The connector can be made of a low-density high-modulus material including a light metal, an engineering ceramic or a fibre-reinforced polymer. In the alternative, it can be made of one of high-modulus engineering alloys including a titanium-based alloy, an iron-based alloy, a nickel-based alloy, a copper-based alloy or a WC—Co cermet.

The piezoelectric active elements can be a lead zirconiate titanate [$PbZrO_3$—$PbTiO_3$] piezo-ceramic and/or a high piezoelectricity lead-based relaxor solid solution single crystal compound including lead zinc niobate-lead titanate [$Pb(Zn_{1/3}Nb_{2/3})O_3$—$PbTiO_3$], lead magnesium niobate-lead titanate [$Pb(Mg_{1/3}Nb_{2/3})O_3$— $PbTiO_3$], lead magnesium niobate-lead zirconate-lead titanate [$Pb(Mg_{1/3}Nb_{2/3})O_3$—$PbZrO_3$—$PbTiO_3$], and lead indium niobate-lead magnesium-niobate-lead titanate [$Pb(In_{1/2}Nb_{1/2})O_3$—$Pb(Mg_{1/3}Nb_{2/3})O_3$—$PbTiO_3$] including their compositionally-modified derivatives.

Further, the HBS connector can include one or more additional openings to aid in handling during manufacture and assembly of the actuator. The actuator can also include at least one of a pedestal, a base plate, a pre-stress mechanism, a casing and/or an anti-twist mechanism.

Other possible designs include higher-level (3×-, 4×-, etc.) piezoelectric actuators comprised of one or multiple cost-effective connectors and/or actuators. Among other uses, the invention can be applied to an underwater projector. The underwater projector can include a head mass, a matching layer, a tail mass, a pre-stress mechanism and/or a casing.

INTRODUCTION

It is, therefore, an aspect of the disclosed embodiments to provide for cost-effective two-level (i.e., 2×-) piezoelectric actuators that produce approximately double axial displacement while maintaining comparable blocking force of respective active elements.

It is, therefore, yet another aspect of the disclosed embodiments to provide derivative devices such as compact Langevin low-frequency underwater projectors, of which the motor section is made of cost-effective HBS connectors and/or actuators of the invention.

Other aspects and advantages of the invention will become apparent from the following detail description, taken in conjunction with the accompanying drawings, illustrating by way of example the principles of the invention.

BRIEF DESCRIPTIONS OF THE DRAWINGS

FIG. 1A depicts a (3+3) high-bending-stiffness (HBS) connector with circumferentially deposited alternating upward-projecting and downward-projecting square-shaped recesses.

Figure 6A:
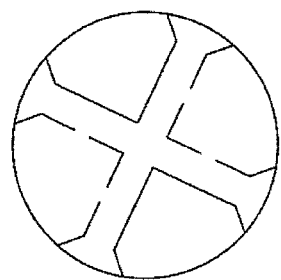
Figure 6A:
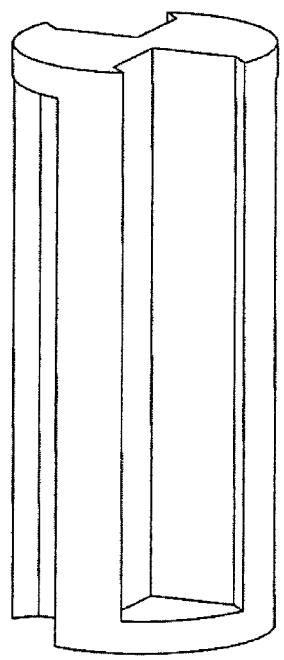

FIG. 6A depicts an example design of a (2+2) HBS connector that has non-circular cross-sectioned recesses with straight full-length wall openings. The wall openings traverse from the base of the recess to the opposite end face of the connector for easy machining purposes. The recesses are designed for housing piezoelectric active elements of triangular cross-section.

Figure 6B:
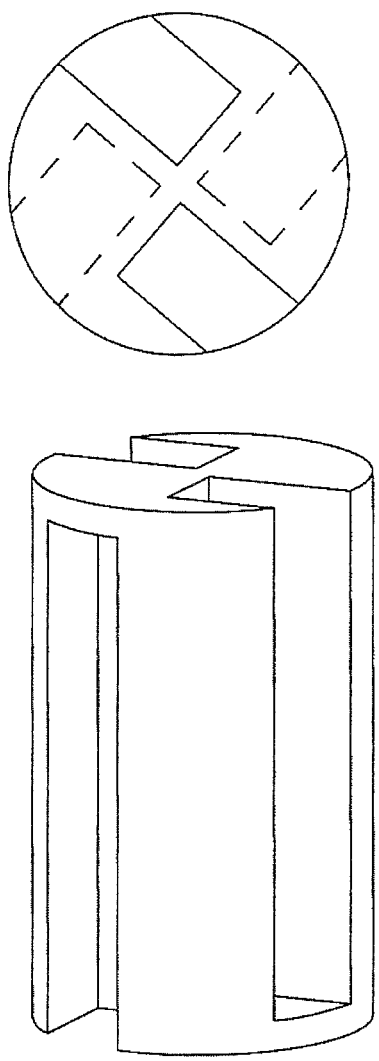

FIG. 6B also depicts an example design of a (2+2) FIBS connector containing non-circular cross-sectioned recesses with straight full-length wall openings for easy machining purposes, with recesses designed for housing piezoelectric active elements of square or rectangular cross-section.

Figure 6C:
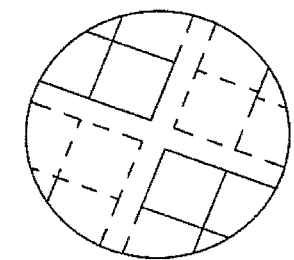
Figure 6C:
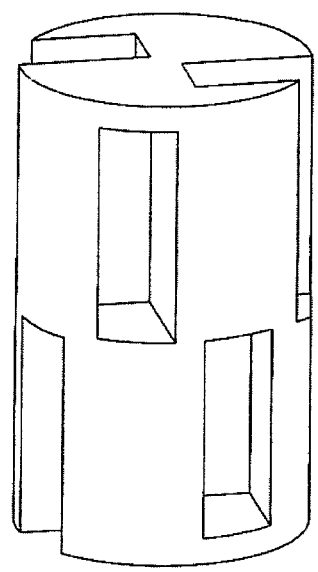

FIG. 6C depicts another example of a (2+2) HBS connector containing non-circular cross-sectioned recesses with split full-length wall openings. The openings are made up of two half-length wall openings or multiple units of shorter wall openings located on adjacent side walls of the recess in staggered formation such that their combined length transverses from the base of the recess to the opposite end face of the connector. Said two half-length wall openings may or may not be physically interconnected.

Figure 6D:
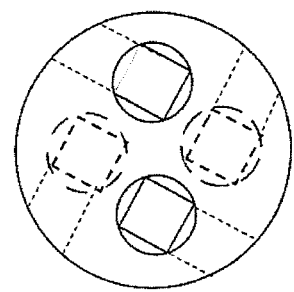
Figure 6D:
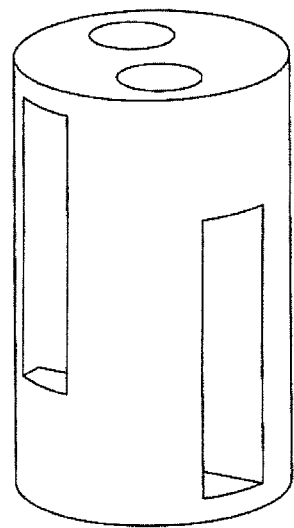

FIG. 6D depicts a (2+2) HBS connector containing non-circular cross-sectioned recesses having straight partial-length wall openings for easy machining purposes. "Partial-length wall opening" refers to the wall opening from the base of the recess that does not extend all the way to the opposite end face of the connector. In a preferred design, the mouth section of the recess that contains no wall opening has a circular cross-section for easy machining.

Figure 6E:
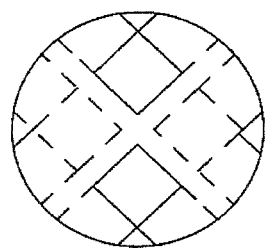
Figure 6E:
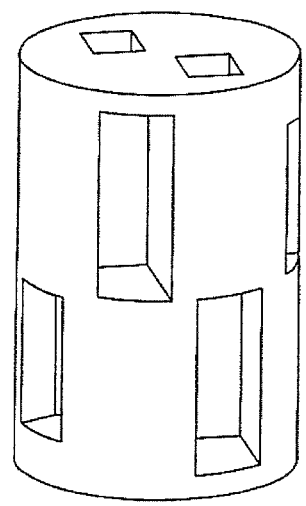

FIG. 6E depicts yet another design of (2+2) HBS connector containing non-circular cross-sectioned recesses having split partial-length wall openings for easy machining purposes. In this example, the two shorter wall openings pertaining to each recess are not physically connected to each other.

Figure 6F:
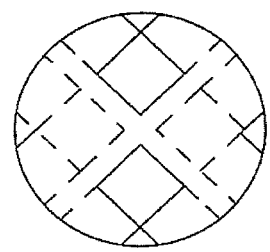
Figure 6F:
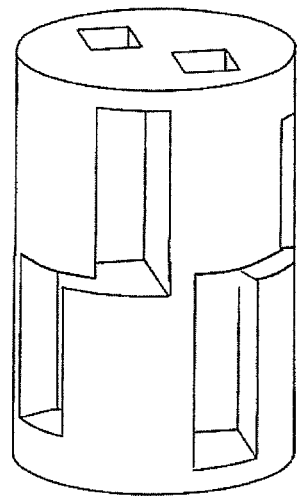

FIG. 6F depicts yet another design of (2+2) HBS connector containing non-circular cross-sectioned recesses having staggered partial-length wall openings. In this example, the two wall openings pertaining to each recess are physically interconnected along a short horizontal section for easy machining purposes.

Figure 6G:
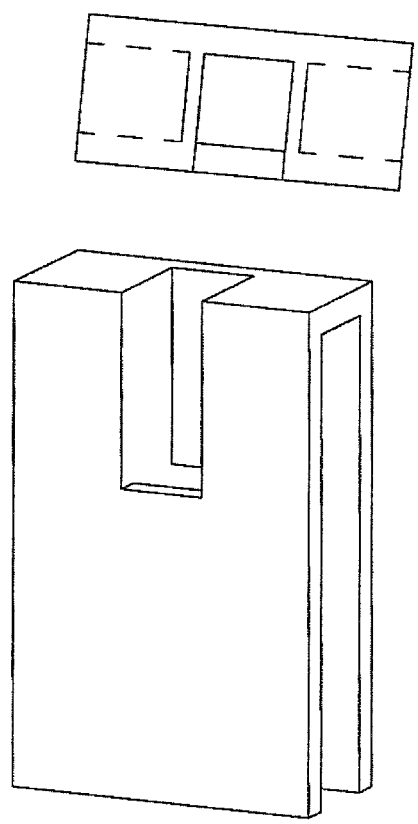

FIG. 6G depicts an alternative design of a (2+1) HBS connector containing non-circular cross-sectioned recesses with full-length wall openings of different designs.

Figure 6H:
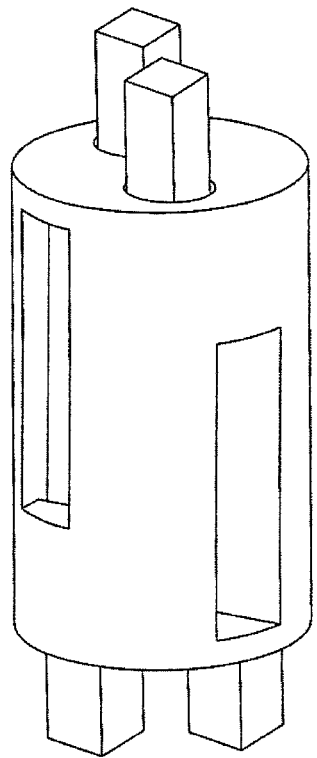

FIG. 6H depicts a 2-level (2×-) piezoelectric actuator made from the (2+2) HBS connector of FIG. 6D fitted with piezoelectric stacks, tubes or bars.

Figure 6I:
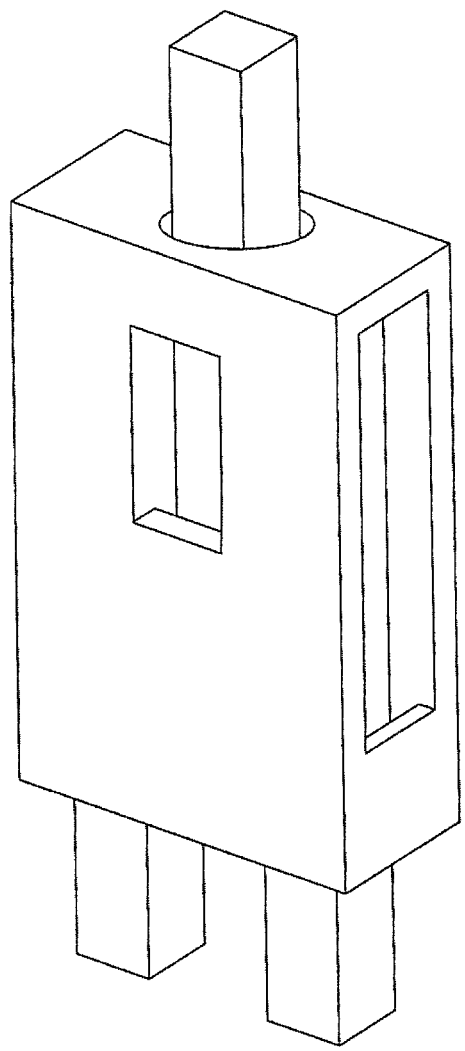

FIG. 6I depicts a 2-level (2×-) piezoelectric actuator made from a (2+1) HBS connector with recesses having partial-length wall openings of different designs which are fitted with piezoelectric stacks, tubes or bars.

Figure 7A:
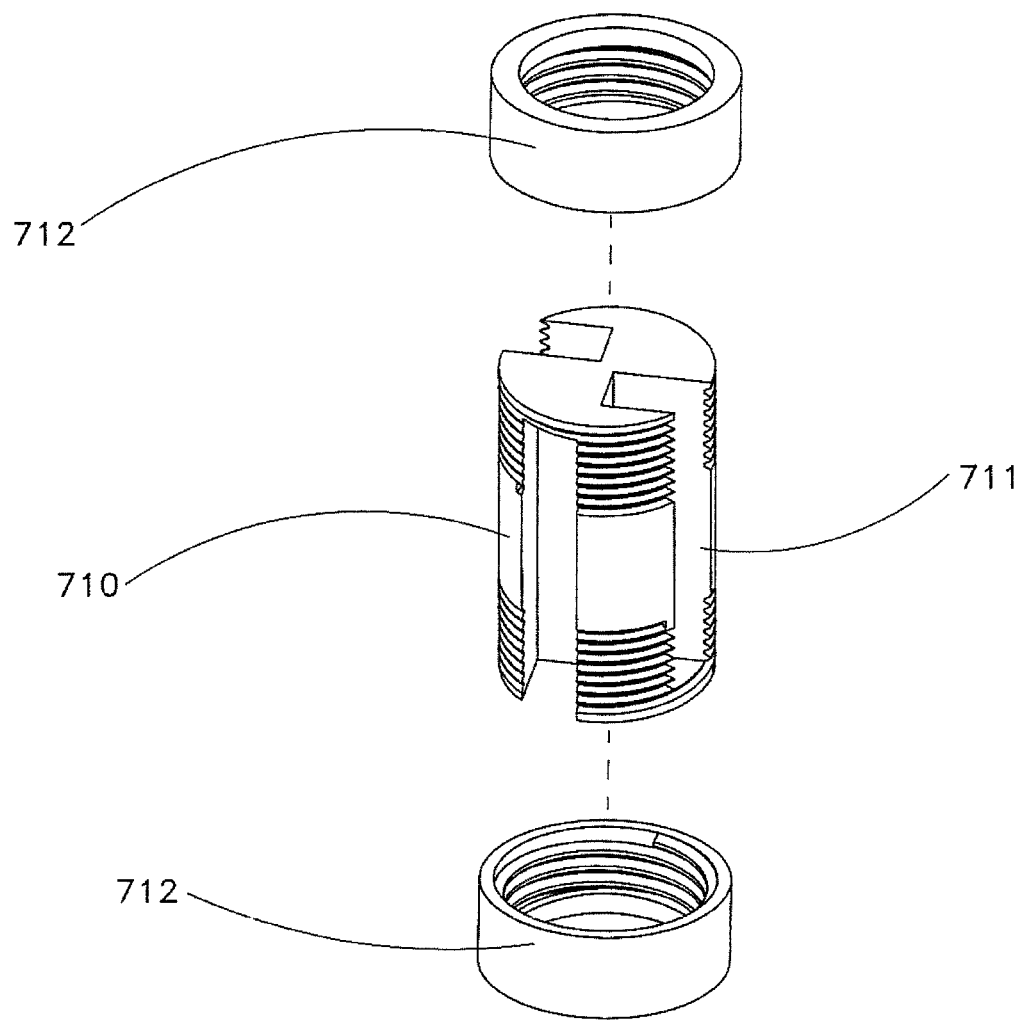
Figure 7B:
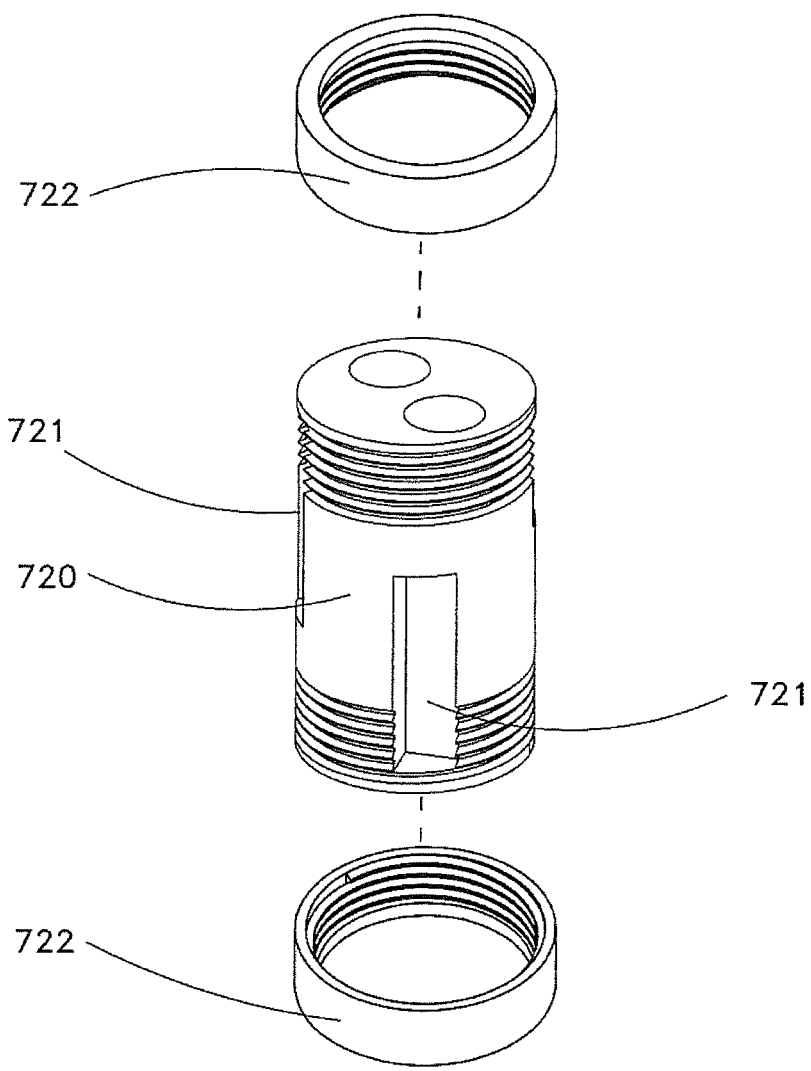

FIGS. 7A and 7B depict example designs of HBS connectors containing non-circular cross-sectioned recesses with wall openings of various designs for easy machining purposes and with screw-on stiffening mechanisms to minimize the bending deflection and distortion of the recess bases of the connector during use.

Figure 7C:
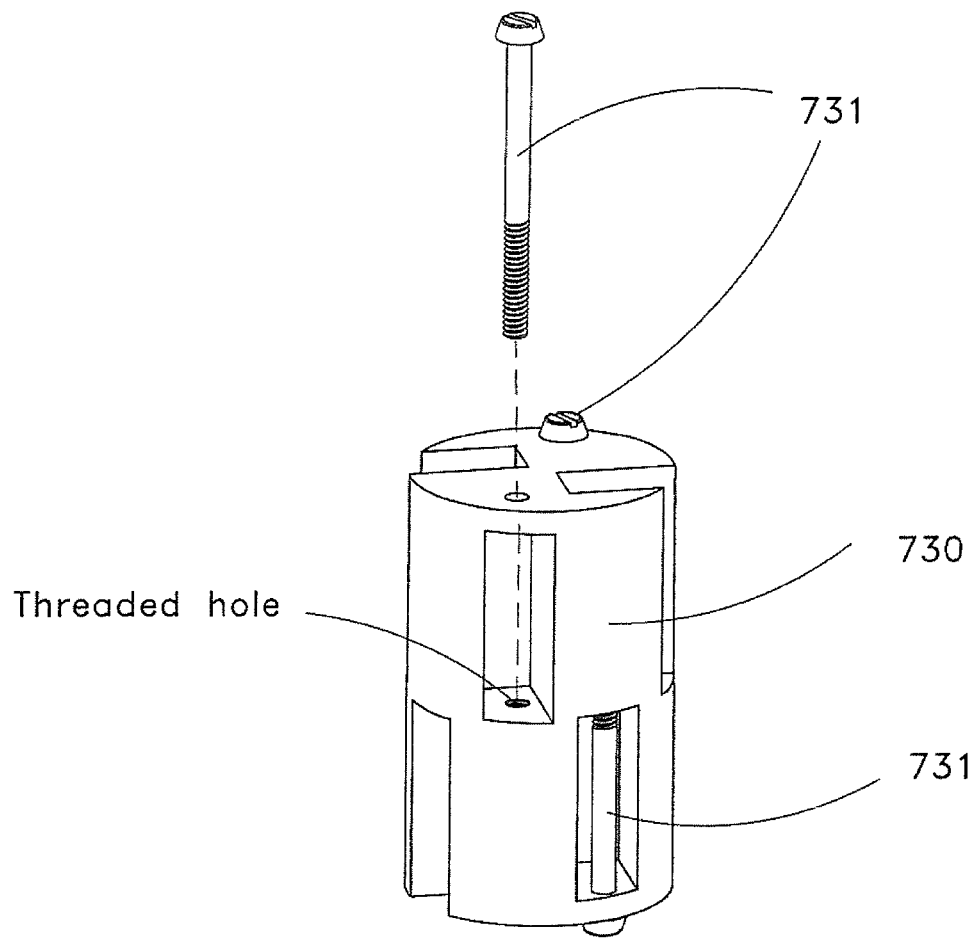
Figure 7D:
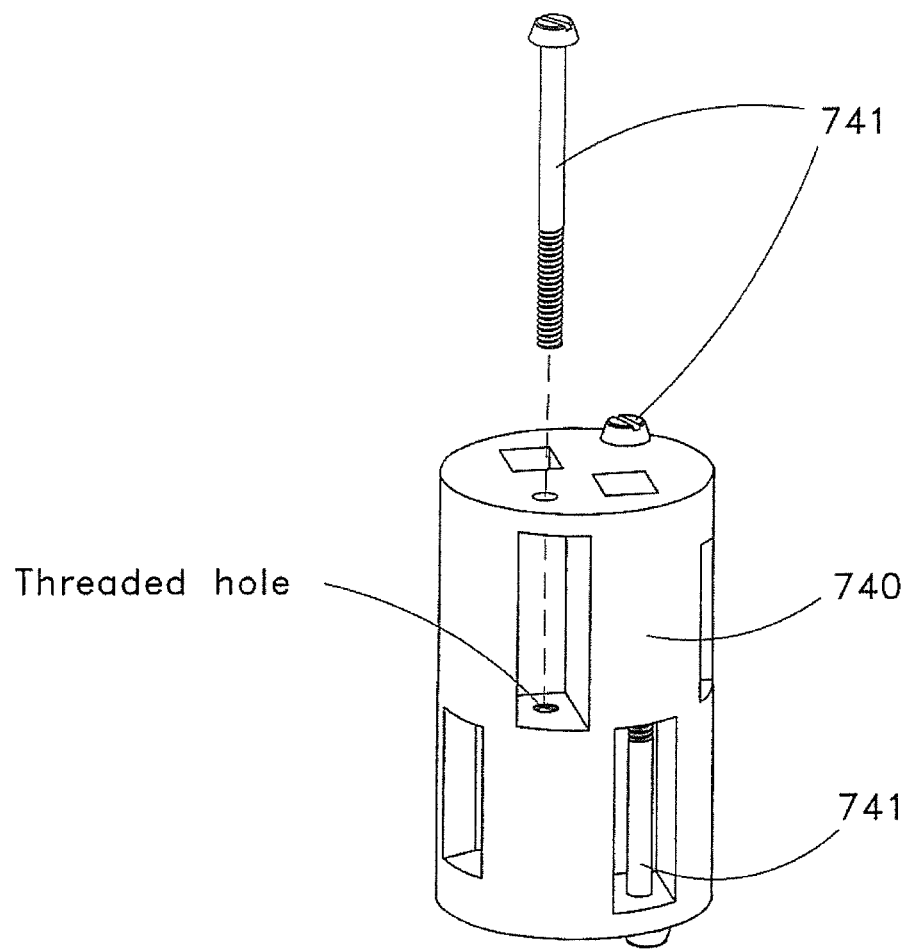

FIGS. 7C and 7D depict example designs of HBS connectors containing non-circular cross-sectioned recesses with wall openings of various designs for easy machining purposes and a bolt design stiffening/reinforcement mechanism to minimize the bending deflection and distortion of the recess bases of the connector during use.

Figure 7E:
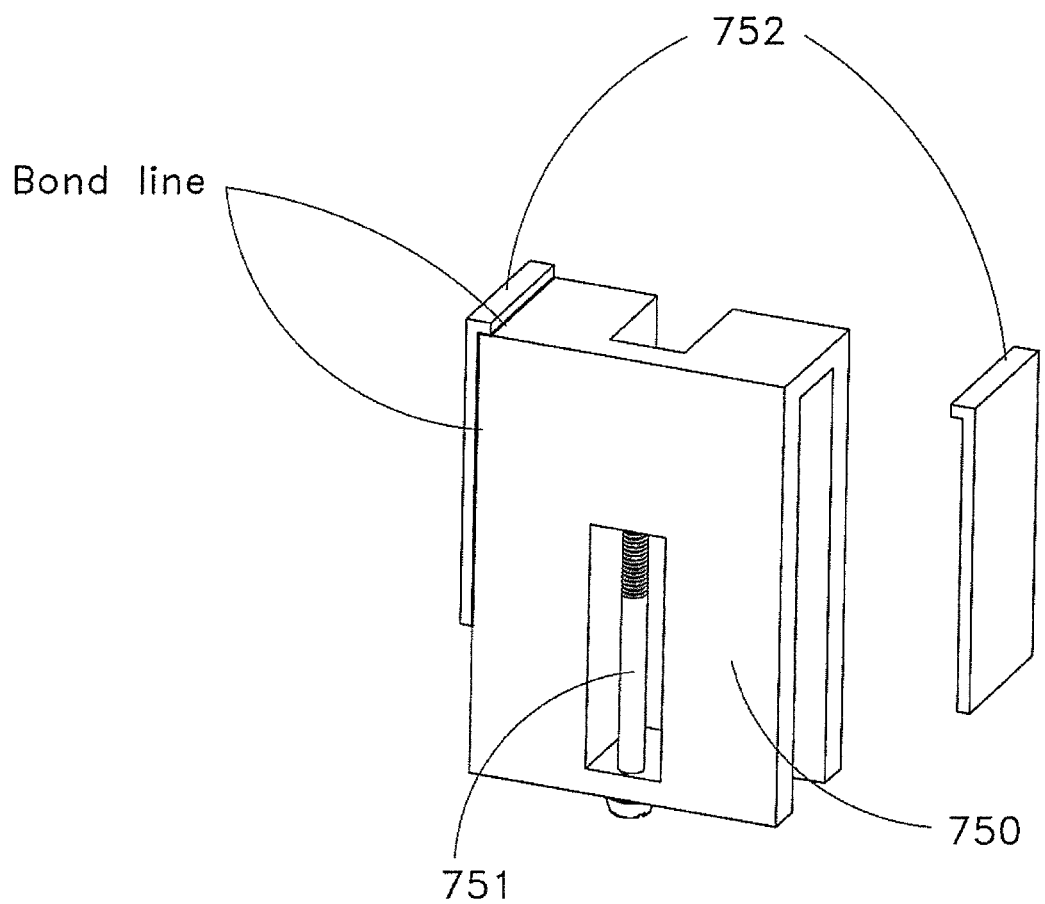

FIGS. 7E and to 7F depict alternative designs of HBS connectors containing non-circular cross-sectioned recesses with wall openings of various designs for easy machining purposes and with additional stiffening mechanisms to minimize the bending deflection and distortion of the recess bases of the connector during use.

DETAILED DESCRIPTION OF THE INVENTION

Definitions

Reference in this specification to "one embodiment/aspect" or "an embodiment/aspect" means that a particular feature, structure, or characteristic described in connection with the embodiment/aspect is included in at least one embodiment/aspect of the disclosure. The use of the phrase "in one embodiment/aspect" or "in another embodiment/aspect" in various places in the specification are not necessarily all referring to the same embodiment/aspect, nor are separate or alternative embodiments/aspects mutually exclusive of other embodiments/aspects. Moreover, various features are described which may be exhibited by some embodiments/aspects and not by others. Similarly, various requirements are described which may be requirements for some embodiments/aspects but not other embodiments/aspects. Embodiment and aspect can be in certain instances be used interchangeably.

The terms used in this specification generally have their ordinary meanings in the art, within the context of the disclosure, and in the specific context where each term is used. Certain terms that are used to describe the disclosure are discussed below, or elsewhere in the specification, to provide additional guidance to the practitioner regarding the description of the disclosure. For convenience, certain terms may be highlighted, for example using italics and/or quotation marks. The use of highlighting has no influence on the scope and meaning of a term; the scope and meaning of a term is the same, in the same context, whether or not it is highlighted. It will be appreciated that the same thing can be said in more than one way.

Consequently, alternative language and synonyms may be used for any one or more of the terms discussed herein. Nor is any special significance to be placed upon whether or not a term is elaborated or discussed herein. Synonyms for certain terms are provided. A recital of one or more synonyms does not exclude the use of other synonyms. The use of examples anywhere in this specification including examples of any terms discussed herein is illustrative only, and is not intended to further limit the scope and meaning of the disclosure or of any exemplified term. Likewise, the disclosure is not limited to various embodiments given in this specification.

Without intent to further limit the scope of the disclosure, examples of instruments, apparatus, methods and their related results according to the embodiments of the present disclosure are given below. Note that titles or subtitles may be used in the examples for convenience of a reader, which in no way should limit the scope of the disclosure. Unless otherwise defined, all technical and scientific terms used herein have the same meaning as commonly understood by one of ordinary skill in the art to which this disclosure pertains. In the case of conflict, the present document, including definitions, will control.

The term "anti-twist mechanism" refers to a device such as a mechanical fitting that permits a corresponding linear movement in the axial direction but prevents twisting of an actuator.

The term "bending stiffness" refers to the resistance of a connector against bending deformation of any of its load-bearing members, or more specifically, the bending displacement of the bases of the machined recesses in the connector in the present invention, which acts to offset the extensional displacement of the piezoelectric active elements housed by it.

The term "blocking force" refers to the applied force required to generate a compressional displacement which equals the combined extensional displacement of the piezoelectric active elements induced by the designed maximum applied electric field.

The terms "$d_{33}$" and "$d_{31}$" refer to a piezoelectric coefficient that relates the mechanical strain generated by a piezoelectric active element when a unit electric field is applied to it.

The term "multi-level actuator" refers to an actuator made of a connector having multiple levels of recesses for housing piezoelectric active elements. A two-level (2×) actuator includes recesses in an upper level and recess in a lower level for housing piezoelectric active elements.

The term "pre-stress mechanism" refers to a device such as a mechanical fitting designed to place the piezoelectric active elements and the various joints in the actuator under due compression to allow dynamic application of a piezoelectric actuator.

The term "small footprint" refers to a device, such as an actuator, that is small in size so that it is easy to incorporate into a complex automated system where precise operation is critical and maintenance is difficult.

DESCRIPTION OF PREFERRED EMBODIMENTS

FIG. 1A illustrates an example of a high-bending-stiffness (HBS) connector 101. An angular longitudinal section is included to illustrate details of the recesses. The connector is comprised of a substantially solid cylindrical body containing recesses 102 which are disposed circumferentially (instead of radially) for housing piezoelectric actuators. In this design, the cross-section of each connector recess is substantially equal to that of the piezoelectric active element that it houses. The base of each piezoelectric active element is firmly connected to the connector body to minimize cantilever loading during use.

Figure 1B:
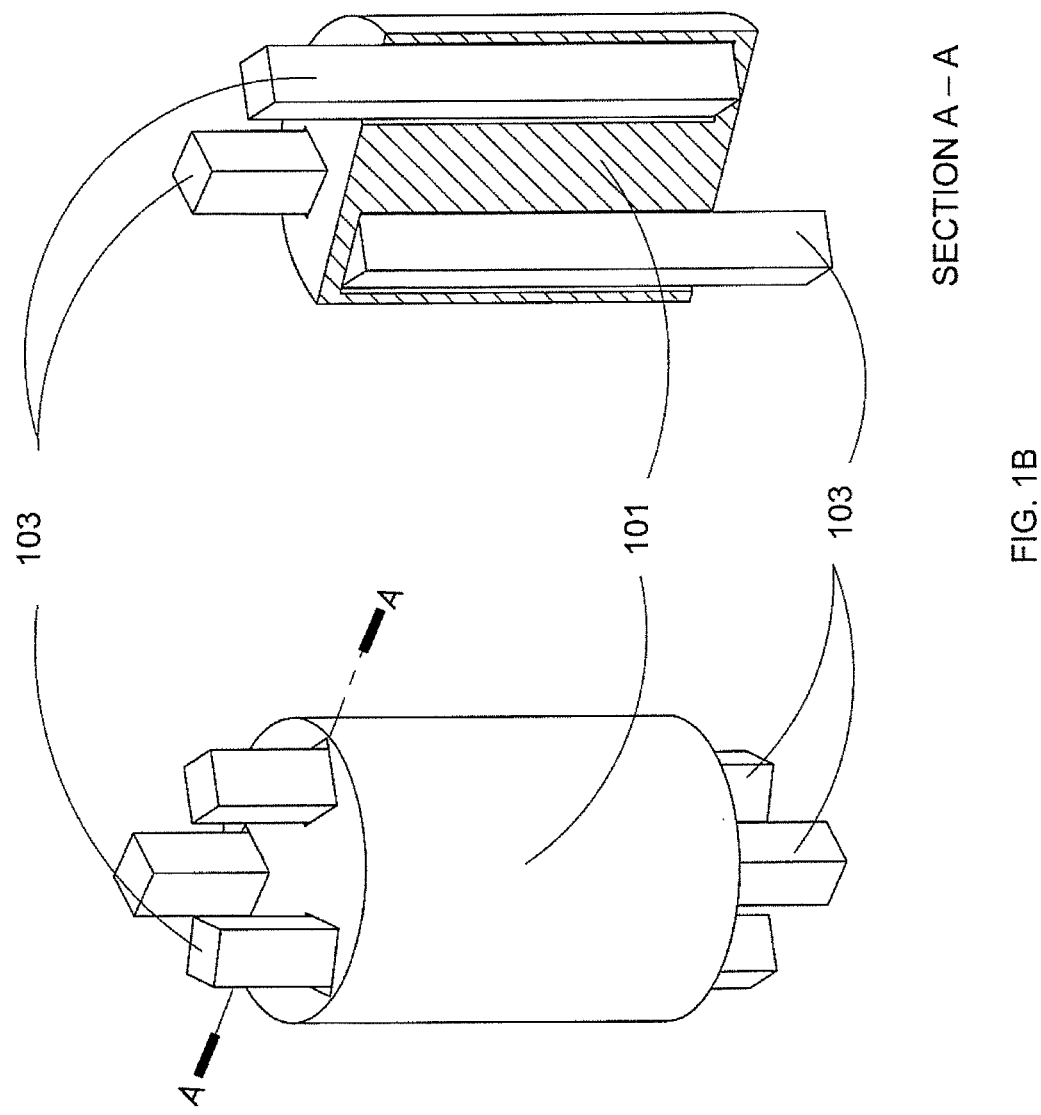
FIG. 1B depicts a derivative 2-level (2×-) actuator made from the (3+3) HBS connector of FIG. 1A in which the square-shaped recesses are fitted with piezoelectric active elements of a similar cross-section.

FIG. 1B illustrates a derivative 2-level actuator that uses the HBS connector of FIG. 1A. When fitted with identical piezoelectric stacks, tubes or bars 103, the resultant actuator approximately doubles the axial displacement of the active material while maintaining the blocking force of respective piezoelectric active elements. For clarity, the wiring connected to the piezoelectric active elements, the top pedestal, the base plate, and the casing are not shown.

In a preferred design, the cross-sections of the connector recesses are substantially equal to the cross-sections of the piezoelectric active element that are housed by each of them. The bases of the active elements are firmly connected to the connector body to minimize cantilever loading during use. The connector approximately doubles the axial displacement of the active material while maintaining comparable blocking force of respective piezoelectric active elements.

The term High-Bending-Stiffness (HBS) connector used herein is defined as a connector comprising the essential features described above. In essence, the connector is machined out of a solid block of either circular, square, rectangular or polygonal cross-section of a desired length. Recesses are circumferentially arranged for housing multiple appropriately wired piezoelectric stacks, tubes or bar actuators, that are alternately projected upward and downward.

In what follows, the symbol "(m+n)" is used to describe the design configurations of different 2-level (2x-) HBS connectors, where "m" and "n" are the numbers of piezoelectric active element at the upper and lower levels, or vice versa. For example, a (2+2) connector will have recesses for connecting two upward projecting piezoelectric active elements for its upper level and two downward projecting piezoelectric active elements for its lower level. The example shown in FIG. 1A is thus a (3+3) HBS connector.

In the initial designs of HBS connectors, the cross-section of each connector recess is substantially equal to that of the piezoelectric active element that it houses. In other words, recesses of circular cross-section are used to house stacks (i.e. active elements) of cylindrical shape. Likewise, recesses of square cross-section are used for housing stacks of approximately square cross-section. This, with the requirement that the base of the recess is firmly connected to the main body of the connector, helps to minimize the bending displacement of the recess base, which otherwise acts against the displacement exhibited by the piezoelectric active elements.

The initial designs employ recesses of circular cross-section for use to house piezoelectric elements that are cylindrically shaped. Such designs do not necessarily cover cases when circular cross-sectioned recesses are used to house non-circular cross-sectioned piezoelectric stacks including those of triangular, square, rectangular and polygonal cross-sections.

For piezoelectric active elements of non-circular cross-section, while maintaining matching cross-section of the recesses helps to minimize the load span and bending displacement of the recess base and hence imparting high stiffness to the connector, the machining of such long, non-circular recesses cannot be achieved cost-effectively using conventional machining techniques.

The above-described long non-circular cross-sectional recesses can be machined out via electrodischarge machining, produced by the 3D additive manufacturing techniques or produced by other suitable non-conventional machining techniques. However, these non-conventional fabrication techniques are both slow and expensive.

Initial designs of piezoelectric actuators also include recesses of either circular, square or rectangular cross-section. They are fitted with piezoelectric active elements of a similar cross-section. While it is relatively economical to make connector recesses of circular cross-section with a flat base by means of conventional machining, fabricating long recesses of small, non-circular cross-sections (including square and rectangular cross-sections) typically requires non-conventional shaping techniques which are expensive and involve very slow shaping processes.

Figure 2A:
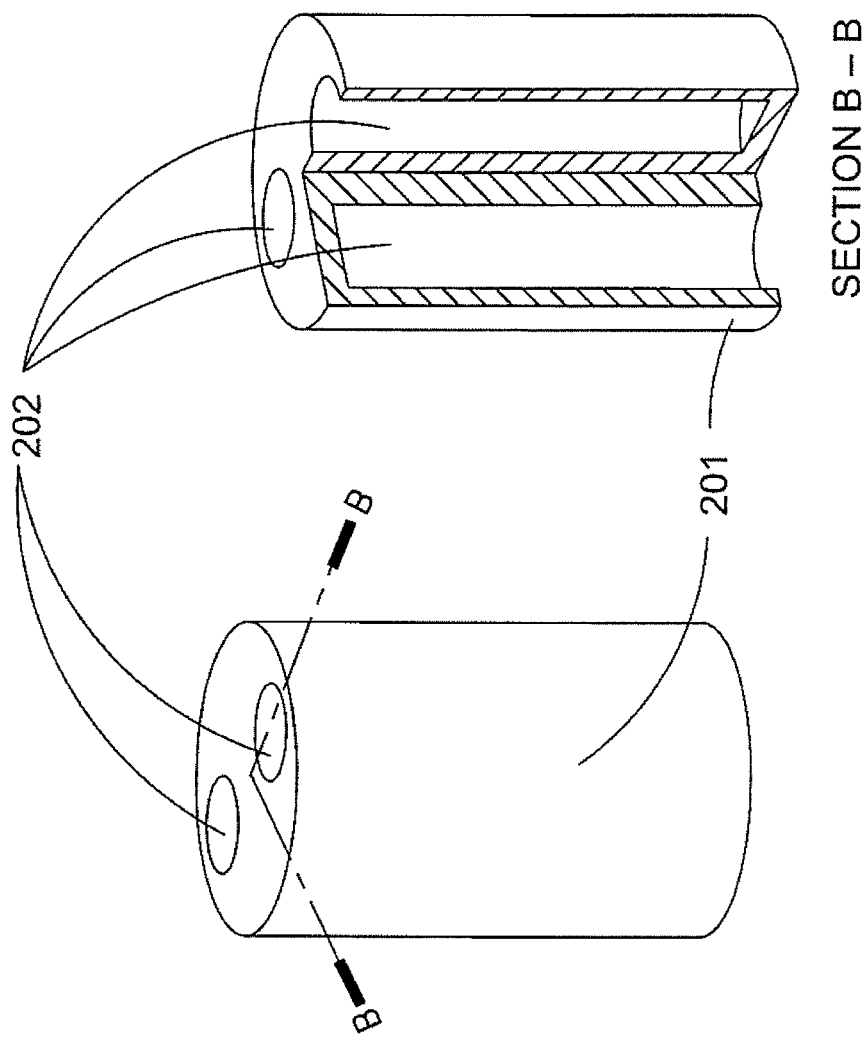
FIG. 2A depicts an embodiment of the invention showing a (2+2) high-bending-stiffness (HBS) connector that has circular cross-sectioned recesses.

Accordingly, one embodiment of the invention includes multi-level piezoelectric actuators comprising an HBS connector with recesses of circular cross-section for cost-effective fabrication of the connector (as in FIG. 2A). However, the circular recesses are fitted with non-circular cross-sectioned piezoelectric stacks or bars. This is a means to reduce the cost of the resultant 2-level piezoelectric displacement actuator.

Figure 2B:
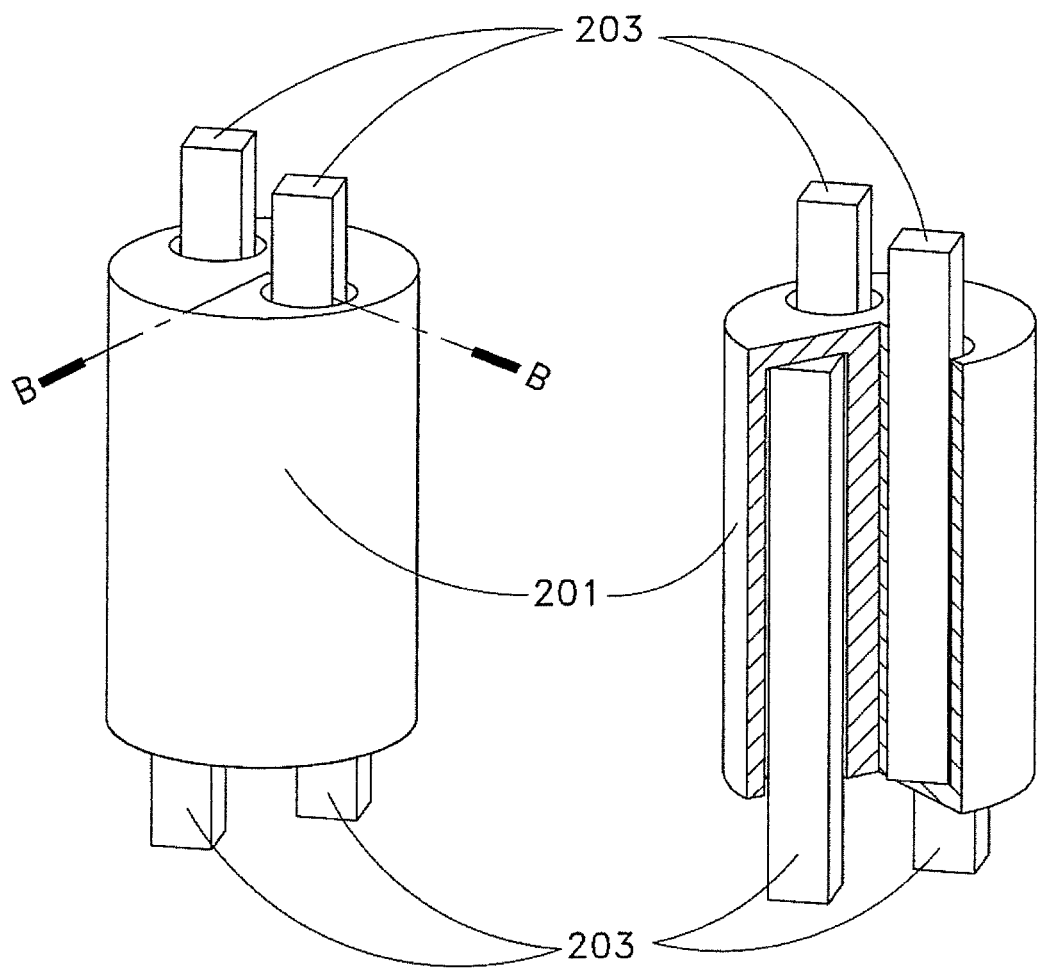
FIG. 2B depicts another embodiment of the invention showing a derivative 2-level (2×-) actuator made from the (2+2) HBS connector of FIG. 2A in which the circular cross-sectioned recesses are fitted with piezoelectric active elements of non-circular cross-section.

FIG. 2A illustrates a connector 201 with circular cross-sectioned recesses 202. As illustrated in FIG. 2B, they can be used to house active elements of non-circular cross-section 203 to make a 2-level (2x-) piezoelectric actuator. The resulting 2x-actuator exhibits comparable activities to initial designs that use circular active elements. Long circular cross-sectioned recesses are relatively easy to machine via conventional machining techniques, making the resultant 2-level (2x) piezoelectric actuator cost effective as well. The wiring connected to the piezoelectric active elements, the top pedestal, the base plate, and the casing are not shown for clarity.

The examples shown in FIGS. 2A and 2B are of (2+2) design. They include two recesses for housing upward projecting piezoelectric active elements (for the upper level) and two other recesses for housing downward projecting piezoelectric active elements (for the lower level). Other design configurations include (1+2), (2+1), (1+3), (3+1), (2+3), (3+2), (3+3), etc., which can be designed according to the application needs.

It is important to note some additional features necessary to limit the bending displacement of the recess base. When housing a square cross-sectioned stack, the bore diameter of the recess should be larger than, but close in size, to the largest lateral dimension of the non-circular cross-sectioned stack or bar. Further, the circumference of the recess base are preferably firmly connected to the main body of the connector.

Figure 3A:
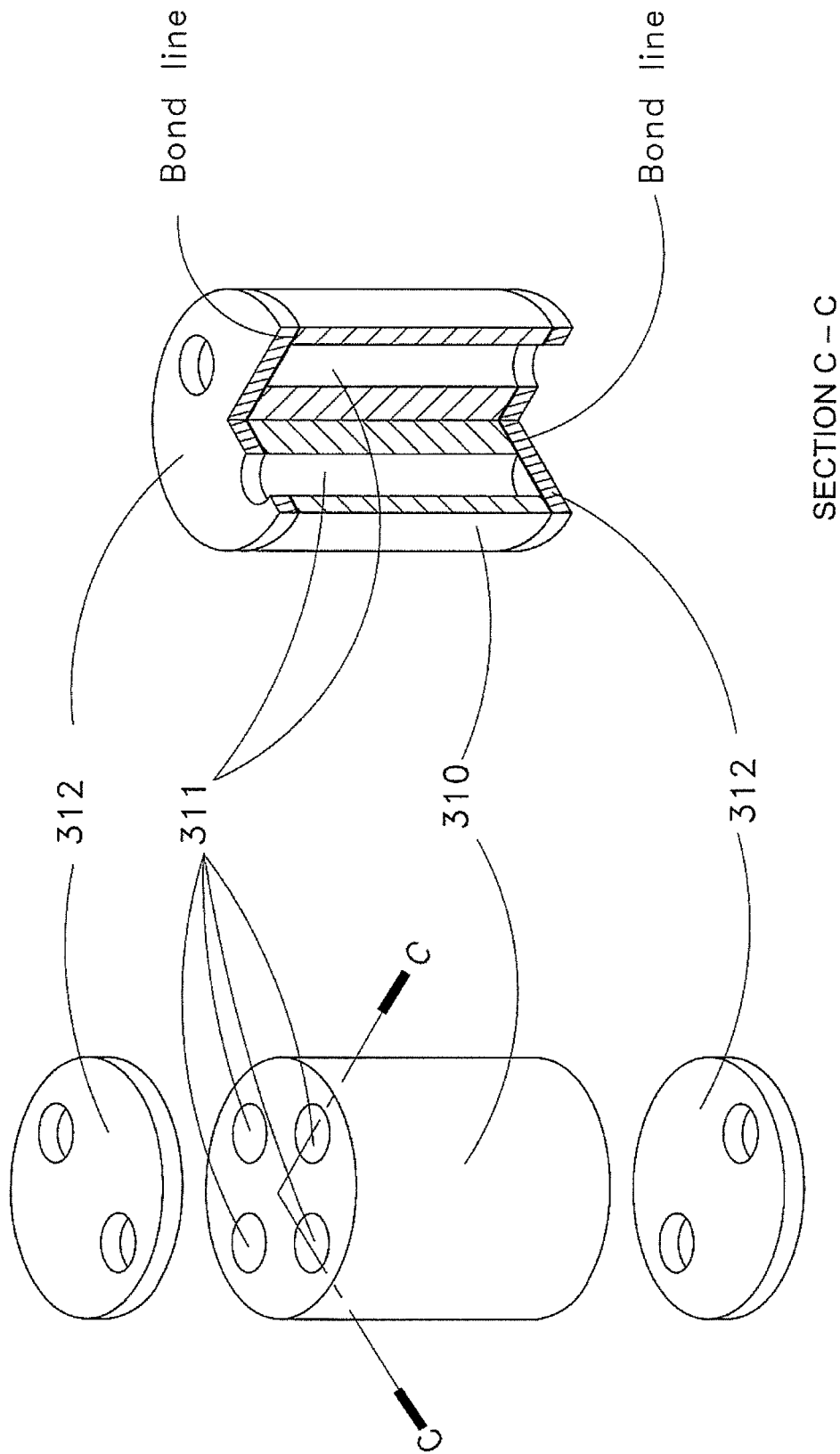
FIG. 3A depicts another example design of a cost-effective HBS connector in which circular through holes are machined out of the connector main body and are then plugged up selectively and firmly at one end with top and bottom end plates to form connector recesses.
Figure 3B:
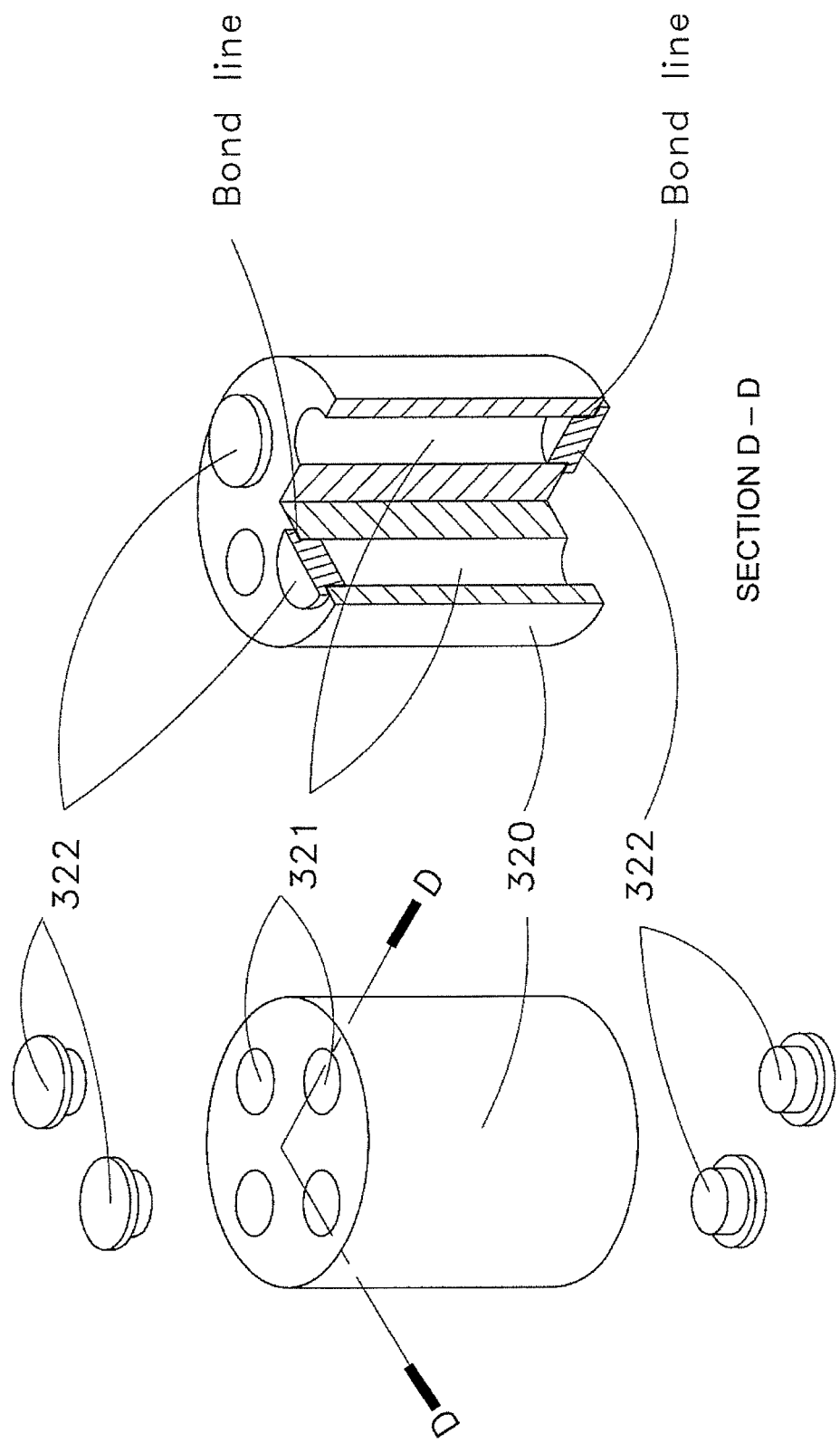
FIG. 3B depicts yet another example design of cost-effective HBS connector in which circular through holes are machined out in the connector main body which are then plugged up selectively and firmly at one end with end plugs to form connector recesses.

FIGS. 3A and 3B depict other example designs of cost-effective HBS connector 310 and 320. In the illustrated designs, the recesses are machined out as through circular holes 311, 321 and end plates 312 (FIG. 3A) and/or end-plugs 322 (FIG. 3B) are brazed, bonded or screwed on firmly to the end faces of the connector body to convert the through holes into connector recesses and complete the HBS connector.

Figure 4:
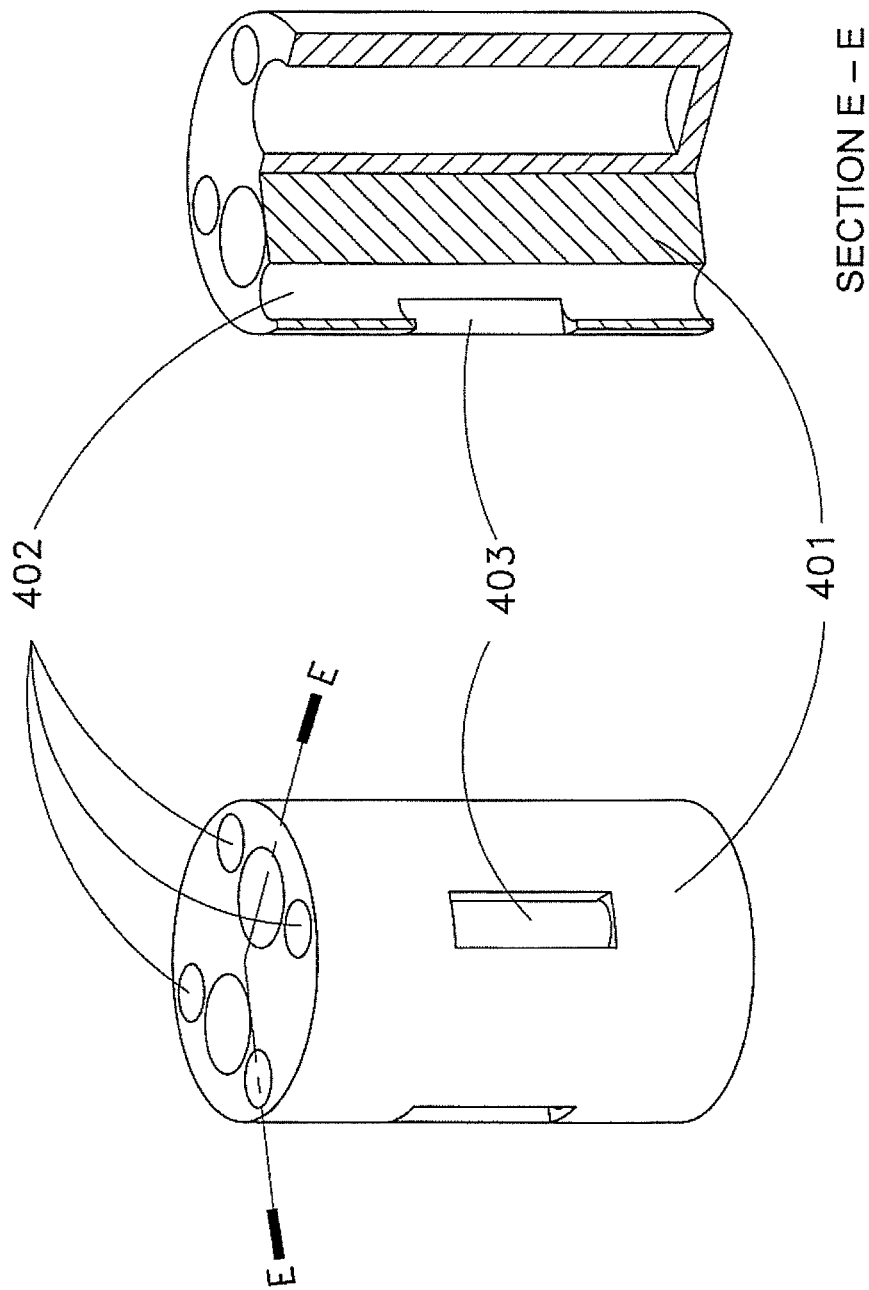
FIG. 4 depicts an HBS connector of a similar design to FIG. 2A but with additional cut-outs and through holes for weight reduction purposes.

The HBS connectors of the present invention can also include additional cut-outs, blind and/or through holes for weight reduction purposes. An example is provided in FIG. 4, in which through holes 402 and cut-outs 403 are incorporated in the HBS connector 401 for said purpose.

The HBS connector can include side and/or other openings of various forms and dimensions to assist with handling the multi-level actuator during its fabrication. These include openings to assist in positioning and bonding of the piezoelectric active element onto the base of the recess, for example, as feedthroughs for lead wires. As described herein, the openings are preferably located in non-critical parts of the connector so that they do not lead to a significant increase in the bending displacement of the connector during use. For example, the circumference of the recess base should preferably remain firmly connected to the main body of the connector to limit the load span during use. This applies to recesses of both circular and non-circular cross-sections.

Figure 5:
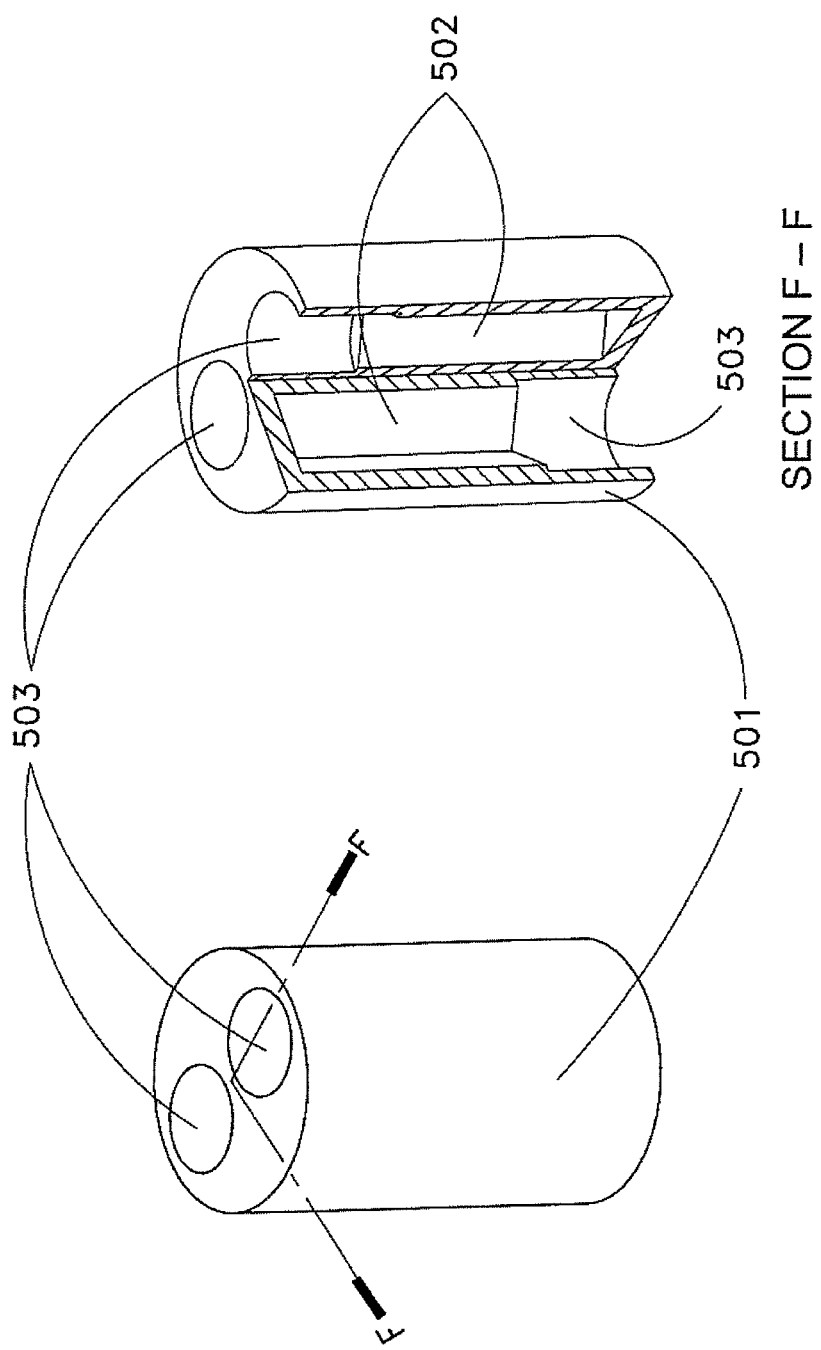
FIG. 5 depicts an example design of a (2+2) HBS connector having recesses of larger cross-section in the mouth section which enables the machining of the long and deep non-circular cross-sectioned recesses below them more cost effective.

HBS Connectors Containing Non-Circular Cross-Sectioned Recesses with Suitable Wall Openings for Easy Machining FIG. 5 depicts an example design of a (2+2) HBS connector 501 containing non-circular cross-sectioned recesses 502 for housing piezoelectric active elements of a similar cross-section. In this design, the mouth section (i.e., the open end portion) of the recesses 503 is of larger cross-section to enable the machining of the long and deep non-circular cross-sectioned recesses underneath more cost effective.

Another embodiment of the invention is the incorporation of suitable openings along the wall of long recesses of non-circular cross-section so that the non-circular cross-sectioned recesses can be readily machined out from the side face of the connector using conventional machining techniques or with reduced use of non-conventional machining techniques.

FIGS. 6A to 6E illustrate examples of HBS connectors containing non-circular cross-sectioned recesses with suitable wall openings of different designs for cost effective fabrication of the connector.

FIGS. 6A and 6B illustrate examples of (2+2) HBS connector containing recesses with straight full-length wall openings, while FIG. 6C shows recesses with split full-length wall openings. A full-length wall opening is one which extends all the way from the recess base to the opposite end face of the connector. In a straight-type design, the wall opening traverses the entire length of the recess. In contrast, a split full-length opening is one made up of two half-length wall openings or multiple shorter wall openings which are located on adjacent side walls of the recess in staggered formation such that their combined vertical length traverses from the base of the recess to the opposite end face of the connector. Full-length wall openings make possible the machining of the non-circular cross-sectioned recesses directly from the side face of the connector without any drilling or milling operation from the end face of the connector.

In contrast, FIGS. 6D to 6F show connectors having recesses with only partial-length wall openings, of straight (FIG. 6D), split (FIG. 6E) and staggered (FIG. BF) design. In a partial-length design, the wall opening, or the combined vertical length of the shorter wall openings, does not extend all the way from the base of the recess to the opposite end face of the connector. In split design (FIG. 6E), the two shorter length wall openings pertaining to each individual recess are not physically interconnected. In staggered design (FIG. 6F), the two shorter length wall openings are physically connected over a short horizontal section for easy machining. The mouth section of the recesses, which contains no wall opening, can be of identical cross-section as the non-circular cross-sectioned recess underneath it, or it can be of a similar but larger cross-section or of a circular cross-section.

FIG. 6G shows a (2+1) connector with non-circular cross-sectioned recesses with full-length wall openings of different designs. The wall opening for the two side recesses are of straight design. That for the central recess is of split design with two half-length openings on opposite side faces of the recess.

While the recesses in FIG. 6A are intended for housing piezoelectric active elements of triangular cross-section, those in FIGS. 6B to 6G are intended for housing piezoelectric active elements of square or rectangular cross-section. Other designs are also possible. Those that reduce the machining cost of the long and deep non-circular cross-sectioned recesses of the HBS connector may be preferred.

FIG. 6H illustrates a derivative (2+2) 2-level piezoelectric actuator made from the cost-effective HBS connector of FIG. 6D.

FIG. 6I depicts a 2-level piezoelectric actuator made of a (2+1) HBS connector of a similar design to FIG. 6F but the wall openings are of partial-length designs.

As illustrated, the cross section of the housed piezoelectric elements is approximately equal to the cross section of the recess. However, piezoelectric elements of other shapes (including those of circular cross-section) can be used provided that the cross-section of the recess is kept small to limit the bending displacement of the recess base during use. The wiring connected to the piezoelectric active elements, the top pedestal, the base plate, and the casing are not shown for clarity. Additional cut-outs, blind and/or through holes can be incorporated into the design of the HBS connector for weight reduction purposes.

HBS Connectors Containing Non-Circular Cross-Sectioned Recesses with Suitable Wall Openings and Reinforced Features While suitable openings along the wall of individual non-circular cross-sectioned recesses can make the fabrication of the HBS connector more cost effective, they can also reduce the bending stiffness of the connector during use. This shortcoming can be minimized by providing additional support and/or stiffeners to limit the extent of deflection of the recess base. A few examples of such stiffening features are illustrated in FIGS. 7A through 7F.

FIG. 7A illustrates an example of a (2+2) HBS connector 710 that includes non-circular cross-sectioned recesses with straight full-length wall openings 711. The wall openings can also be useful in fabrication purposes, for example, as points of contact to secure and move the connector. A ring type stiffening/reinforcement feature is also illustrated (712), wherein both top and bottom stiffening rings can be applied via a screw-on mechanism. Alternatively, the top and bottom stiffening rings can be applied via adhesive bonding or bolting.

FIG. 7B illustrates another example of a (2+2) HBS connector 720 that includes non-circular cross-sectioned recesses with straight partial-length wall openings 721 and top and bottom stiffening rings 722. Both the top and bottom stiffening rings can be applied via a screw-on mechanism, adhesive bonding or bolting.

FIG. 7C illustrates a (2+2) cost-effective FIBS connector 730 with split full-length wall openings and a simple bolt design stiffening/reinforcement mechanism. In the illustrated design, the overhanging portion of the recess base is reinforced by a suitably sized bolt of high stiffness 731 which is firmly screwed onto the remaining half material above the half-length wall opening. A large-diameter but stiff bolt head is preferred to provide effective reinforcement.

FIG. 7D illustrates a (2+2) cost-effective HBS connector 740 with split partial-length wall openings and a simple bolt design stiffening/reinforcement mechanism. In the illustrated design, the overhanging portion of the recess base is reinforced by a suitably sized bolt made of a high stiffness metal 741 which is firmly screwed onto the remaining top-half material above the partial-length opening. A large-diameter but stiff bolt head is preferred to provide effective reinforcement.

FIG. 7E illustrates a (2+1) cost-effective HBS connector 750 having recesses of full-length wall openings and different base reinforcement designs. While the base of the central recess is reinforced with a high-stiffness bolt 751, those of both side recesses are reinforced with a specially machined bar that has an end protrusion in the form of a ledge or chamfer 752. The bar can be bonded onto the side of the opening so that its protruded ledge or chamfer is firmly bonded onto the bottom face of the overhanging portion of the recess base to support it. Alternatively, the bar 752 can be secured onto the sides of the opening using screws (not shown).

Figure 7F:
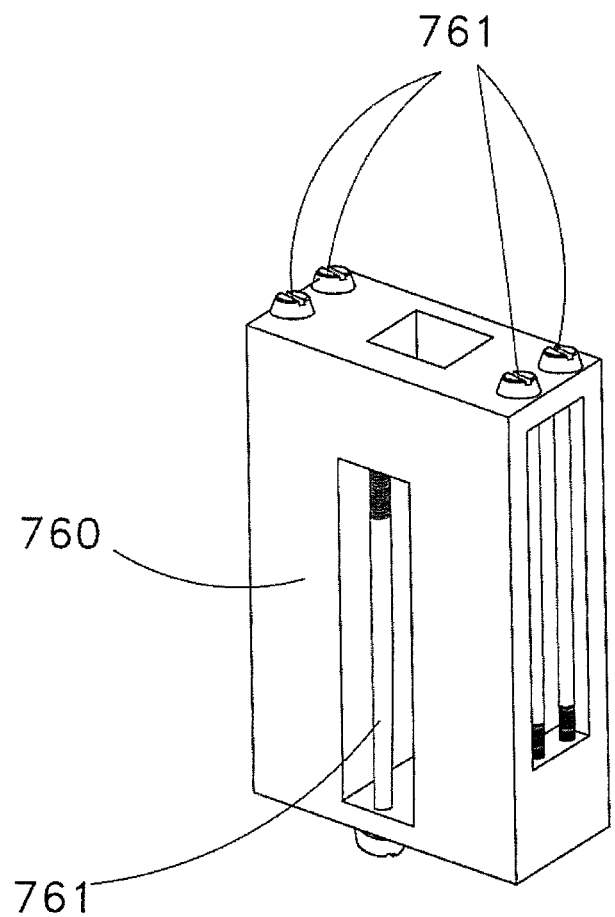

FIG. 7F illustrates a (2+1) cost-effective HBS connector 760 having recesses of partial-length wall openings with bases of all the three non-circular cross-sectioned recesses reinforced by means of high-stiffness bolts 761 which are firmly screwed onto the remaining material above the wall opening.

When desired, the HBS connector which makes up the 2-level piezoelectric actuator can contain additional cut-outs, openings, blind and/or through holes for weight reduction purposes when weight is a key design consideration.

Materials of Construction and Predicted Performance

The cost-effective connectors of various types of the present invention can be made of a low-density but high modulus material including a light metal, an engineering ceramic or a fibre-reinforced polymer. In the alternative, they can be made from a high modulus engineering alloy including a titanium-based alloy, an iron-based alloy, a nickel-based alloy, a copper-based alloy or a WC—Co cermet.

Finite Element Simulation Results

Finite element simulation was performed to estimate the induced bending displacements of the recess base and the resultant axial displacements of the various cost-effective HBS connectors described herein. The results for HBS connectors made of pure aluminium, of about 22 mm in outer diameter and 36 mm in height for the (2+2) design and having various recess cross-sections but the same base thickness of 2 mm are provided in Table 1.

The results demonstrate that for HBS connectors and 2-level actuators in which square-cross-sectioned recesses are used to house square-cross-sectioned piezoelectric stacks, of 5.5×5.5 mm$^2$ and 5×5 mm$^2$ respectively, the induced net axial displacement (i.e., extension) of the connector under a total axial load of 20 kg is about 2.0 µm for the (2+2) design (Row 1).

For compact pure aluminium HBS connectors of the present invention of (2+2) design comprising circular cross-sectioned recesses of 7.8 mm bore diameter and fitted with 5×5 mm$^2$ square cross-sectioned piezoelectric stacks, the combined axial extension of the connector under the same axial load is less than 2.6 µm (Rows 2).

For FIBS connectors with recesses each having a full-length wall opening of either straight or split design (FIGS. 6B and 6D), the net axial extension of the connector may be as large as 5.5 µm with appreciable twisting of the recess base noted (Rows 3 and 4).

For HBS connectors of (2+2) design comprising square cross-sectioned recesses with partial-length wall openings of various designs (FIGS. 6C and 6E), the net axial displacements under the same loading conditions remain small at <3.5 µm (Rows 5 and 6).

The simulation results further show that the various base reinforcement mechanisms are effective in limiting the net axial displacements of HBS connectors with wall openings of different designs. The predicted net axial displacement is reduced to <3.0 µm in all the examples studied (Rows 7 to 10).

The simulation results for (2+1) HBS connectors of various designs, made of aluminium of 29 mm×12 mm×26 mm in width, thickness and height respectively, are provided in Table 2. The predicted net axial displacements are in the range of 4.0-4.5 µm for HBS connector containing recesses without any wall opening (Rows 1 and 2). The net displacements can be up to 5 µm for (2+1) connector having recesses with full-length wall openings (Row 3) but is limited to ≈4 µm for recesses with partial-length wall openings (Row 4) without any base reinforcement (Row 4). With different base reinforcements, the net displacement can be reduced to <4 µm (Rows 5 and 6).

In other words, while (2+1) designs save material cost as only three instead of more piezoelectric active elements are needed, their axial displacements are about 25% larger compared with the (2+2) designs. This amounts to <6% of the combined stroke of the resultant 2-level piezoelectric actuator if piezoelectric stacks of 35-40 mm in length are used as the active element, which are acceptable for many engineering applications.

While the net axial displacements of the connectors under load tend to offset the electric field induced axial displacement of the piezoelectric actuators, the unique structure of the HBS connectors of the present invention has limited its net axial displacement to <3.5 µm for the various (2+2) designs cited (ignoring the designs with full-length wall openings without any base reinforcement) and to <4.5 µm for the (2+1) designs. This amounts to only a small fraction (i.e., being about 4-6%) of the combined stroke of the resultant 2-level piezoelectric actuators.

The following features can be used to further limit the bending displacement of the recess base of the cost-effective HBS connector of the present invention during use: (a) bonding of high-stiffness load pads at the base of individual recesses and/or (b) bonding of high-stiffness end-plates with suitable openings onto both end faces of the connector.

Further, the cost effective HBS connector can include a central hole passing through it, and/or one or more other openings to aid handling during manufacture and assembly of the 2-level actuator (not shown).

Typical materials and compounds for active elements suitable for the invention include lead zirconate titanate [PbZrO$_3$—PbTiO$_3$] piezo-ceramics and their compositionally modified derivatives, and/or high-piezoelectricity relaxor-based solid solution single crystals of suitable compositions and cuts, including lead zinc niobate-lead titanate [Pb(Zn$_{1/3}$Nb$_{2/3}$)O$_3$—PbTiO$_3$], lead magnesium niobate-lead titanate [Pb(Mg$_{1/3}$Nb$_{2/3}$)O$_3$—PbTiO$_3$], lead magnesium niobate-lead zirconate-lead titanate [Pb(Mg$_{1/3}$Nb$_{2/3}$)O$_3$—PbZrO$_3$—PbTiO$_3$], lead indium niobate-lead magnesium-niobate-lead titanate [Pb(In$_{1/2}$Nb$_{1/2}$)O$_3$—Pb(Mg$_{1/3}$Nb$_{2/3}$)O$_3$—PbTiO$_3$] solid solutions and their compositionally modified derivatives.

Moreover, any of the above disclosed active elements can be an individual or any suitably bonded piezoelectric active element, as is known in the relevant art. For example, a component piezoelectric element can be a stand-alone piezo-ceramic or single crystal bar, rod or tube, of either longitudinal (d$_{33}$) or transverse (d$_{31}$ or d$_{32}$) mode, or a bonded assemblage of single crystal rings or bars of any suitable cross-section including but not limiting to piezoceramic stacks and single crystal stake actuator (See, for example, WO 2013/100860).

In addition to the necessary wiring, the actuator can further comprise at least one pedestal, a base plate, and a casing. The actuator can also include a pre-stress mechanism to place the components and joints under compression during use. Similarly, the actuator can include an anti-twist mechanism (not shown).

Because cost-effective HBS-2x-connectors of the present invention are comparatively rigid with high bending stiffness, the displacement produced by the two-level (2x) actuator made from said connectors will be approximately the sum of displacement displayed by individual levels. In other words, if all active elements are of the same cut and dimensions, then the displacement produced by the two level (2×) actuator of the present invention will be approximately twice that of individual active elements, while the blocking force of the two-level actuator is about n-times larger, where n is the number of active elements per level.

It should be noted that the blocking force of the resultant actuator could be increased either by using: (i) active elements of larger cross-sectional (i.e., load bearing) area or (ii) a larger number of active elements per level, without significantly increasing the foot-print of the actuator.

Alternatively, the blocking force of the resultant actuator can be doubled or tripled by connecting two or three units of cost-effective 2× actuator in parallel to form the resultant actuator.

Other Derivative Devices

The present invention also includes derivative devices in which at least one unit of cost-effective HBS-2× connector and/or actuator is used as means of piezoelectric actuation. These include higher-level (3×, 4×, 5×, etc.) piezoelectric displacement actuators. Also included, are underwater projectors in which at least one cost-effective 2×- or higher-level connector is used as its motor section with or without a head mass, tail mass, stress rod, compression or disc springs and lock nuts. In the latter example, the cost-effective HBS-connector can also act as an intermediate mass which, when appropriately designed, helps to increase the bandwidth of the device. The control of the weight of the HBS connector can be crucial in such an application.

It will be obvious to a skilled person that the configurations, dimensions, materials of choice of the present invention may be adapted, modified, refined or replaced with slightly different but equivalent designs to enable cost-effective manufacture of the HBS connector, and additional features may be added to further enhance the bending stiffness of resultant connectors. Furthermore, additional protection features, as use of corrosion resistant materials and the incorporation of anti-twisting features may be incorporated in the design of the final devices. These substitutes, alternatives, modifications, or refinements are considered as falling within the scope and letter of the following claims.

Although embodiments of the current disclosure have been described comprehensively, in considerable detail to cover the possible aspects, those skilled in the art would recognize that other versions of the disclosure are also possible. Furthermore, variations of the above disclosed and other features and functions, or alternatives thereof, may be desirably combined into many other different systems or applications. These alternatives, modifications, variations or improvements, which may be subsequently made by those skilled in the art for various applications, are also considered to be encompassed by the following claims.

TABLE 1

Finite Element Analysis Results of Net Axial Displacement of Various (2 + 2) MBS Connectors of the Present Invention Made of Pure Aluminium

| S/No. | Connector Configuration | Net axial displacement* (μm) | Remarks |
| --- | --- | --- | --- |
| 1 | (2 + 2) design of FIG. 1A/1B with 5.5 × 5.5 mm$^2$ square cross-sectioned recesses fitted with 5 × 5 mm$^2$ square cross-sectioned stacks | 2.0 | |
| 2 | (2 + 2) of FIG. 2A/2B with 7.8 mm dia. circular cross-sectioned recesses fitted with 5 × 5 mm$^2$ square cross-sectioned stacks (connector overall dimensions ≈25 mm dia. × 36 mm length) | 2.6 | |
| 3 | (2 + 2) of FIG. 6B with 5.5 × 5.5 mm$^2$ square cross-sectioned recesses with straight full-length wall openings fitted with 5 × 5 mm$^2$ square cross-sectioned stacks | 4.5 | Twisting of base noted. |
| 4 | (2 + 2) of FIG. 6C with 5.5 × 5.5 mm$^2$ square cross-sectioned recesses with split full-length wall openings fitted with 5 × 5 mm$^2$ square cross-sectioned stacks | 5.4 | Twisting of base noted. |
| 5 | (2 + 2) of FIG. 6D/6G with 5.5 × 5.5 mm$^2$ square cross-sectioned recesses with straight partial-length wall openings fitted with 5 × 5 mm$^2$ square cross-sectioned stacks | 3.0 | |
| 6 | (2 + 2) of FIG. 6E with 5.5 × 5.5 mm$^2$ square cross-sectioned recesses split partial-length wall openings fitted with 5 × 5 mm$^2$ square cross-sectioned stacks | 3.0-3.5 | |
| 7 | (2 + 2) of FIG. 7A with 5.5 × 5.5 mm$^2$ square cross-sectioned recesses with straight full-length wall openings and top and bottom reinforced rings and fitted with 5 × 5 mm$^2$ square cross-sectioned stacks | 2.9 | |
| 8 | (2 + 2) of FIG. 7B with 5.5 × 5.5 mm$^2$ square cross-sectioned recesses with straight partial-length wall openings and top and bottom reinforced rings and fitted with 5 × 5 mm$^2$ square cross-sectioned stacks | 2.8 | |
| 9 | (2 + 2) of FIG. 7C with 5.5 × 5.5 mm$^2$ square cross-sectioned recesses with split full-length wall openings and S.S. bolt reinforcement and fitted with 5 × 5 mm$^2$ square cross-sectioned stacks | 3.0 | |
| 10 | (2 + 2) of FIG. 7D with 5.5 × 5.5 mm$^2$ square cross-sectioned recesses with split partial-length wall openings with S.S. bolt reinforcement and fitted with 5 × 5 mm$^2$ square cross-sectioned stacks | 2.6-2.8 | |

*Said displacement offsets the axial displacement of piezoelectric actuators induced by the applied electric field and hence should be minimized.
(Key: Unless otherwise stated, connector overall dimensions ≈22 mm dia. × 36 mm length; recess base thickness = 2 mm; total axial load applied = 20 kg)

TABLE 2

Finite Element Analysis Results of Net Axial Displacement of Various
(2 + 1) HBS Connectors of the Present Invention Made of Pure Aluminium

| S/No. | Connector Configuration | Net axial displacement of connector* (μm) | Remarks |
|---|---|---|---|
| 1 | (2 + 1) with 5.5 × 5.5 mm² square cross-sectioned recesses fitted with 5 × 5 mm² square cross-sectioned stacks (overall dimensions ≈26.5 mm × 19.5 mm × 36 mm height) | 3.8 | |
| 2 | (2 + 1) with 7.8 mm dia. circular cross-sectioned recesses fitted with 5 × 5 mm² square cross-sectioned stacks | 4.5 | |
| 3 | (2 + 1) of FIG. 6F with 5.5 × 5.5 mm² square cross-sectioned recesses with full-length wall openings and fitted with 5 × 5 mm² square cross-sectioned stacks | 4.7 | |
| 4 | (2 + 1) of FIG. 6H with 5.5 × 5.5 mm² square cross-sectioned recesses with partial-length wall openings and fitted with 5 × 5 mm² square cross-sectioned stacks | 4.1 | |
| 5 | (2 + 1) of FIG. 7E with 5.5 × 5.5 mm² square cross-sectioned recesses with full-length wall openings and base reinforcements, fitted with 5 × 5 mm² square cross-sectioned stacks | 3.8 | |
| 6 | (2 + 1) of FIG. 7F with 5.5 × 5.5 mm² square cross-sectioned recesses with partial-length wall openings and base reinforcements, fitted with 5 × 5 mm² square cross-sectioned stacks | 3.2-3.5 | |

*Said displacement offsets the axial displacement of piezoelectric actuators induced by the applied electric field and hence should be minimized.
(Key: Unless otherwise stated, connector overall dimensions ≈29 mm × 12 mm × 36 mm in width, thickness and height respectively; recess base thickness = 2 mm; total axial load applied = 20 kg)

What is claimed is:

1. A multi-level piezoelectric actuator comprised of a high bending stiffness (HBS) connector and a plurality of piezoelectric active elements, wherein said HBS connector comprises:
   a connector body that is an elongated component of either circular, square, rectangular or polygonal cross-section having a first end face, and a second end face in an opposed, substantially parallel relationship to said first end face;
   a first set of multiple recesses, each perpendicular to said second end face, equally spaced and arranged circumferentially and extending substantially into the connector body from a mouth in said second end face to a recess base at said first end face;
   a second set of multiple recesses, each perpendicular to said first end face and extending substantially into the connector body from a mouth in said first end face to a recess base at said second end face;
   wherein both first set and second set of recesses are created by machining holes of substantial depth into the connector body with their bases firmly connected to the connector body;
   wherein the two sets of recesses intersperse with one another and are spaced at approximately equal angular separation along the circumference of the connector body;
   wherein each recess is shaped to house a piezoelectric active element;
   wherein the depth of each recess is shorter than the length of the piezoelectric active element that it houses; and
   wherein the plurality of piezoelectric active elements are divided into two sets with the first set projecting out of the first end face and the second set projecting out of the second end face of the HBS connector, and wherein both sets of the piezoelectric active elements operate in unison to produce an overall axial displacement approximately twice (2×) that of respective piezoelectric active elements and of blocking force comparable to or larger than that of respective piezoelectric active elements.

2. The actuator of claim 1, wherein the recesses are of circular cross-sectional shape; and
   wherein each recess houses a piezoelectric active element with a circular cross-sectional shape.

3. The actuator of claim 1, wherein the recesses are of circular cross-sectional shape; and
   wherein each circular cross-sectioned recess houses a piezoelectric active element with a non-circular cross-sectional shape.

4. The actuator of claim 1 wherein each recess has a mouth section and a recess body;
   wherein the mouth section is of circular cross-sectional and the recess body is of circular or non-circular cross-sectional shape; and
   wherein the mouth section has a larger cross-sectional area than the recess body to enable the recesses to be more easily machined out.

5. The actuator of claim 1 wherein the recesses are of non-circular cross-sectional shape, and
   wherein each recess has a wall opening traversing the full length of the recess to enable the recess to be more easily machined out.

6. The actuator of claim 1 wherein the recesses are of non-circular cross-sectional shape;
   wherein each recess has multiple wall openings located on different sides of the recess which can be physically interconnected; and
   wherein the combined vertical length of the openings traversing the full length of the recess to enable the recess to be more easily machined out.

7. The actuator of claim 1 wherein the recesses are of non-circular cross-sectional shape, each with a mouth section and a recess body;

wherein each recess has a wall opening along the length of its recess body; and wherein the mouth section of each recess has no wall opening and is of larger circular cross-sectional area than its recess body to enable the recess to be more easily machined out.

8. The actuator of claim 1 wherein the recesses are of non-circular cross-sectional shape, each with a mouth section and a recess body;

wherein each recess has multiple wall openings along its recess body on different side walls that can be physically connected; and wherein the mouth section of each recess is of a larger circular cross-sectional area than its recess body to enable the recess to be more easily machined out.

9. The actuator of claim 4, wherein the cross-section of the recess body is of triangular, square, rectangular or other polygonal shape.

10. The actuator of claim 1, further comprising one or more additional stiffening mechanisms to reduce the deflection displacement of the recess base.

11. The actuator of claim 1, wherein said connector body further comprises a central hole passing through its center.

12. The actuator of claim 1, wherein said connector is made of a low-density high-modulus material including a light metal, an engineering ceramic or a fibre-reinforced polymer.

13. The actuator of claim 1, wherein said connector is made of one of high-modulus engineering alloys including a titanium-based alloy, an iron-based alloy, a nickel-based alloy, a copper-based alloy or a WC—Co cermet.

14. The actuator of claim 1 containing additional cut-outs, openings, blind and/or through holes for weight reduction purposes.

15. A 2-level (2×-) piezoelectric actuator comprised of the cost effective HBS connector according to claim 1 and a plurality of piezoelectric active elements.

16. The actuator of claim 15, wherein the piezoelectric active elements comprise one of a longitudinal mode active element or a transverse mode active element of either circular or non-circular cross-section.

17. The actuator of claim 16, wherein the piezoelectric active elements comprise one of piezo-ceramic, individual or bonded assemblages of piezoelectric single crystals.

18. The actuator of claim 17, wherein the piezoelectric active elements comprise a lead zirconiate titanate [$PbZrO_3$—$PbTiO_3$] piezo-ceramic and/or a high piezoelectricity relaxor-based solid solution single crystal compound selected from the group consisting of: lead zinc niobate-lead titanate [$Pb(Zn_{1/3}Nb_{2/3})O_3$— $PbTiO_3$], lead magnesium niobate-lead titanate [$Pb(Mg_{1/3}Nb_{2/3})O_3$— $PbTiO_3$], lead magnesium niobate-lead zirconate-lead titanate [$Pb(Mg_{1/3}Nb_{2/3})O_3$—$PbZrO_3$—$PbTiO_3$], and lead indium niobate-lead magnesium-niobate-lead titanate [$Pb(In_{1/2}Nb_{1/2})O_3$—$Pb(Mg_{1/3}Nb_{2/3})O_3$—$PbTiO_3$] including their compositionally-modified derivatives.

19. The actuator of claim 1, wherein the HBS connector includes one or more additional openings to aid in handling during manufacture and assembly of the actuator.

20. A 3 level or 4-level piezoelectric actuator, of overall displacement approximately 3× or 4× that of respective piezoelectric active elements, comprised of one or more cost-effective HBS connectors according to claim 1.

21. An underwater projector comprising a motor section having an actuator as claimed in claim 1.

* * * * *